United States Patent
Ludwig

(10) Patent No.: US 9,400,166 B2
(45) Date of Patent: Jul. 26, 2016

(54) SENSOR ARRANGEMENT

(75) Inventor: Ronny Ludwig, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 161 days.

(21) Appl. No.: 14/349,823

(22) PCT Filed: Aug. 7, 2012

(86) PCT No.: PCT/EP2012/065418
§ 371 (c)(1),
(2), (4) Date: Apr. 4, 2014

(87) PCT Pub. No.: WO2013/050192
PCT Pub. Date: Apr. 11, 2013

(65) Prior Publication Data
US 2014/0232378 A1    Aug. 21, 2014

(30) Foreign Application Priority Data
Oct. 4, 2011  (DE) .................. 10 2011 083 948

(51) Int. Cl.
*G01R 33/02* (2006.01)
*G01B 7/30* (2006.01)
*G01L 3/10* (2006.01)

(52) U.S. Cl.
CPC . *G01B 7/30* (2013.01); *G01L 3/104* (2013.01); *G01R 33/02* (2013.01)

(58) Field of Classification Search
CPC .......... G01B 7/30; G01R 33/02; G01R 33/07; G01R 33/09; G01L 3/104; G01L 5/221; G01D 5/12; G01D 5/14; G01D 5/147
See application file for complete search history.

(56) References Cited

U.S. PATENT DOCUMENTS 5,195,382 A * 3/1993 Peilloud ................ G01D 5/145
324/209

FOREIGN PATENT DOCUMENTS

| | | |
|---|---|---|
| AU | 643046 | 11/1993 |
| CN | 201754113 | 3/2011 |
| CN | 201828370 | 5/2011 |
| DE | 102007028481 | 12/2008 |
| JP | 59063539 | 4/1984 |
| JP | 9043072 | 2/1997 |

OTHER PUBLICATIONS

International Search Report for Application No. PCT/EP2012/065418 dated Oct. 24, 2013 (English Translation, 2 pages).

* cited by examiner

*Primary Examiner* — Son Le
(74) *Attorney, Agent, or Firm* — Michael Best & Friedrich LLP

(57) ABSTRACT

The invention relates to a sensor arrangement (2) for determining a relative rotation of two shafts that are arranged coaxially to one another (4, 6), which sensor arrangement comprises at least one magnetic element (29) arranged on a first shaft (4), at least one magnetic element (29) arranged on a second shaft (6) and at least one magnetic field-sensitive sensing element (20), which is arranged in a stationary manner between the magnetic elements (29) of the two shafts (4, 6) and which captures a magnetic field that results from the superposition of the magnetic fields (32) of the magnetic elements (29) of both shafts (4, 6).

14 Claims, 8 Drawing Sheets

SENSOR ARRANGEMENT

BACKGROUND OF THE INVENTION

The invention relates to a sensor arrangement and a method for determining a relative rotation of two shafts that are arranged coaxially with respect to one another.

Nowadays, magnetic measuring principles are frequently used in the case of torque sensors for shafts. In the case of torque sensors of this type, a magnetic pole ring is arranged on a first shaft. Furthermore, two magnetically soft rings are arranged on a second shaft that is arranged coaxially with respect to the first shaft, a Hall sensor being arranged between said magnetically soft rings. In the case of a torsion or rotation of the two shafts relative to one another, a changing magnetic field of the magnetic pole ring is amplified between the two magnetically soft rings and is detected by the Hall sensor. A signal of the Hall sensor is furthermore converted into a torque signal.

The publication DE 10 2007 028 481 A1 describes a sensor arrangement of this type that comprises at least one sensor element that detects magnetic field data, which is based on a rotation of at least one flux ring relative to a magnetic pole wheel, as a measurement for a torque and/or a difference angle. In addition, the sensor element that is used in this case comprises an integrated circuit.

SUMMARY OF THE INVENTION

A relative rotation of the two shafts that are arranged coaxially with respect to one another can be determined with the aid of the sensor arrangement for two shafts. For this purpose, at least one magnetic element is arranged on each shaft. It is possible to provide in each case on one shaft several magnetic elements that are arranged on the shaft next to one another in an adjacent manner. Field lines of magnetic fields of adjacent magnetic elements can be aligned in the radial direction around a circle about an axis of rotation of a shaft in the same direction. A pole transition is provided on a contact surface between the poles, in other words between the north and south pole of a magnetic element and between the north and south pole of two adjacent magnetic elements. Generally, several magnetic elements can be arranged on each shaft, wherein each shaft comprises the identical number of magnetic elements.

Each magnetic element is embodied as a permanent magnet that comprises a magnetic field having a fixedly predefined alignment of field lines of the magnetic field. Furthermore, the magnetic elements are fastened to the shafts. It is possible to fasten a magnetic element in such a manner that magnetic field lines of the magnetic element on the shaft are aligned in the north-south or south-north direction in the axial direction of the shaft depending on the definition. It is possible by means of at least one magnetic field-sensitive measuring element to detect a superposed magnetic field that results from a magnetic field of at least one magnetic element that is fastened to a first shaft and a magnetic field at least of one magnetic element that is fastened to a second shaft. If the two shafts rotate relative to one another, the resulting superposed magnetic field changes so that a measurement for the rotation of the shafts relative to one another can be deduced from a field strength of the superposed magnetic field and/or a direction or alignment of the field lines of the superposed magnetic field.

Furthermore, an arrangement of several magnetic elements that can be embodied as ring segments on a shaft is also described as a magnetic pole ring, wherein in accordance with the definition it is provided that a magnetic pole ring of this type comprises at least one magnetic element. Several magnetic elements are arranged directly next to one another in a circle about the axis of rotation of the shaft. If the magnetic pole ring comprises several magnetic elements, a gap can be located around the circle between two adjacent magnetic elements so that adjacent magnetic elements do not come into contact with one another. In this case, a so-called open magnetic pole ring is present. It is also possible that adjacent magnetic elements come into contact with one another, wherein magnetic elements can be arranged around the entire circle and each magnetic element comprises a direct neighbor. In this case, a so called closed magnetic pole ring is present.

In one embodiment, the sensor arrangement that is provided comprises two similar and thus identically embodied magnetic pole rings that comprise the magnetic elements, wherein each magnetic pole ring is arranged on a shaft. A magnetic pole ring can be embodied as a circumferential multi-pole magnetic ring. The two magnetic pole rings are arranged on the two shafts in such a manner that they lie opposite one another.

In one embodiment, in each case a magnetic pole ring that is arranged on top of and/or against one of the two shafts and generally comprises at least one magnetic element can be embodied for example as a synthetic material bonded magnet that is produced by means of injection molding processes, wherein several magnetic elements are connected to one another. A magnetic pole ring can be arranged on a synthetic material substrate that is in turn arranged on a metal sleeve that can be compressed onto the corresponding shaft. As a consequence, an exact position of the magnetic elements of the two magnetic pole rings in the radial and axial direction with respect to one another is achieved whilst maintaining a radial and axial spacing between the magnetic elements. The two magnetic pole rings are embodied identically in relation to the number of the pole transitions and the magnetization of the magnetic elements. This can be achieved by virtue of the fact that the two magnetic pole rings are magnetized simultaneously and in parallel in the identical arrangement, in other words under identical conditions.

An arrangement of the magnetic elements and consequently of the magnetic pole rings with respect to one another occurs so that generally in an initial position of the two shafts relative to one another, in which the two shafts are rotated about an angle of 0° and consequently not rotated relative to one another, identical poles of magnetic elements in each case lie opposite one another in relation to an alignment of the field lines, in other words north pole to north pole and south pole to south pole. This results in the magnetic fields that are generated by means of the magnetic elements compensating for each other in the initial position midway between the two magnetic elements and consequently they cancel each other out.

In one embodiment, at least one magnetic field-sensitive measuring element, for example at least one Hall sensor and/or at least one AMR-sensor, for measuring an anisotropic magneto-resistance effect is arranged exactly midway between the magnetic elements of the two shafts. A magnetic field-sensitive measuring element is generally arranged on a circuit board having additional circuitry and a plug for providing a contact. The circuit board is spatially fixed and is consequently securely arranged in comparison to the shafts that can be rotated. The magnetic elements can rotate relative to the circuit board and therefore to the magnetic field-sensitive measuring elements. This renders it possible to measure a relative rotation of the shafts to one another of more than 360°.

The gap between the at least one magnetic element of the first shaft and the at least one magnetic element of the second shaft and consequently of the two magnetic pole rings with respect to one another can be selected to be of such a small dimension that the magnetic fields of the magnetic elements on the two shafts mutually affect one another, wherein the magnetic fields are distorted. In the ideal scenario, a resulting magnetic field from the magnetic fields of the magnetic elements that are arranged on the two shafts is equal to zero in the initial position exactly midway between two magnetic elements and/or between the two magnetic pole rings. If relative rotation occurs between the two shafts, the magnetic elements and consequently the magnetic pole rings are rotated relative to one another. As a consequence, the superposed magnetic field changes midway between the magnetic elements. This magnetic field that is changed in dependence upon the magnitude of relative rotation can for example be measured with the aid of the at least one magnetic field-sensitive measuring element. The measurement of a change in the magnetic field is consequently a measurement for the magnitude of rotation of the two shafts relative to one another.

In order to ensure that the measurement is not ambiguous, it is provided in one embodiment that the maximum magnitude of rotation of the magnetic elements and/or the two magnetic pole rings relative to one another does not exceed the region of a pole transition between two poles of a magnetic element and/or of two adjacent magnetic elements. In general, for example in steering systems of motor vehicles, a torsion in the region of +/−4° is to be measured. Thus, a maximum of 44 magnetic elements and twice as many pole transitions are arranged in each case on a circumference of a magnetic pole ring (360°/8°=45). In one embodiment, 16 magnetic elements and consequently 32 pole transitions are provided per magnetic pole ring.

Since the directions of the field lines of the magnetic fields also change periodically in dependence upon the magnitude of relative rotation and number of reversals in polarity between poles of a magnetic element and/or of two adjacent magnetic elements on a shaft, by way of example in sine or cosine form, changes of the direction of the field characteristics can also be measured and evaluated with the aid of one or several magnetic field-sensitive measuring elements that are by way of example embodied as Hall or AMR sensors.

A field strength of the superposed magnetic field that is to be detected within the framework of the invention generally comprises a sine or cosine form profile. The maxima and minima of this sine or cosine form profile are located between identical poles, in other words between two south poles or two north poles, wherein in each case a pole is arranged as a component of a magnetic element on one of the two shafts. A zero crossing and consequently a so-called sine or cosine flank of the profile of the superposed magnetic field is generally located between two pole transitions, wherein in each case a pole transition is arranged on a shaft and is formed by means of a limit range of two adjacent, different poles, in other words between a north pole and a south pole. A steepness of the sine flank in the zero crossing of a sine function that is proportional to a change of the resulting magnetic field is in this case a measure of the magnitude of rotation of the shafts relative to one another.

Since a relative change of the resulting magnetic field is very low to zero in the maxima and minima of the sine function, several magnetic field-sensitive measuring elements are arranged in one embodiment of the invention by way of example in a rotationally symmetrical manner, the periodicity of said measuring elements being different from a periodicity of the magnetic pole rings. The combination of at least one Hall sensor and at least one AMR sensor for measuring the field change is also feasible. As a consequence, both the field strengths as well as the field direction of the resulting magnetic field can be measured in parallel. Furthermore, it is possible in the case of a suitable arrangement of the magnetic field-sensitive measuring elements also to determine a direction in which the shafts are rotating relative to one another. Generally, a relative measurement of a torsion and as a consequence a torque between two shafts can be achieved with the aid of the sensor arrangement, said shafts generally being connected by way of a torsion rod.

The sensor arrangement can be achieved in a very compact structural form requiring very little space, especially in the axial overall height of the structure, with an axial height of less than 20 mm. In contrast to known comparable complex constructions for torque detection, flux conducting rings of soft magnetic material, by way of example NiFe metal sheet can be omitted as magnetic flux collectors. Since two magnetic pole rings are embodied as exactly identical components, production costs can be reduced as a result of the increased number being produced. In addition, a relatively simple construction and connecting technique is provided and a wear-free measurement is also possible. An alternative to conventional torque sensors can be provided with the invention. Furthermore, only weak magnetic fields are required in the case of a small gap between the two magnetic pole rings. This renders possible the use of ferritics as a magnetic material, whereby rare earth metals such as by way of example SmCo or NdFeB can be dispensed with.

The sensor arrangement in accordance with the invention is embodied for the purpose of implementing all the steps of the proposed method. Individual steps of this method can also be implemented by individual components of the sensor arrangement. Furthermore, functions of the sensor arrangement or functions of individual components of the sensor arrangement can be implemented as steps of the method. In addition, it is also possible that steps of the method are achieved as a function at least of one component of the sensor arrangement or of the entire sensor arrangement.

Further advantages and embodiments of the invention are evident in the description and the attached drawings.

It goes without saying that the features that are mentioned above and that are yet to be described hereinunder can not only be used in the respective disclosed combination, but rather they can also be used in other combinations or can stand alone without departing from the framework of the present invention.

DETAILED DESCRIPTION

Figure 1:
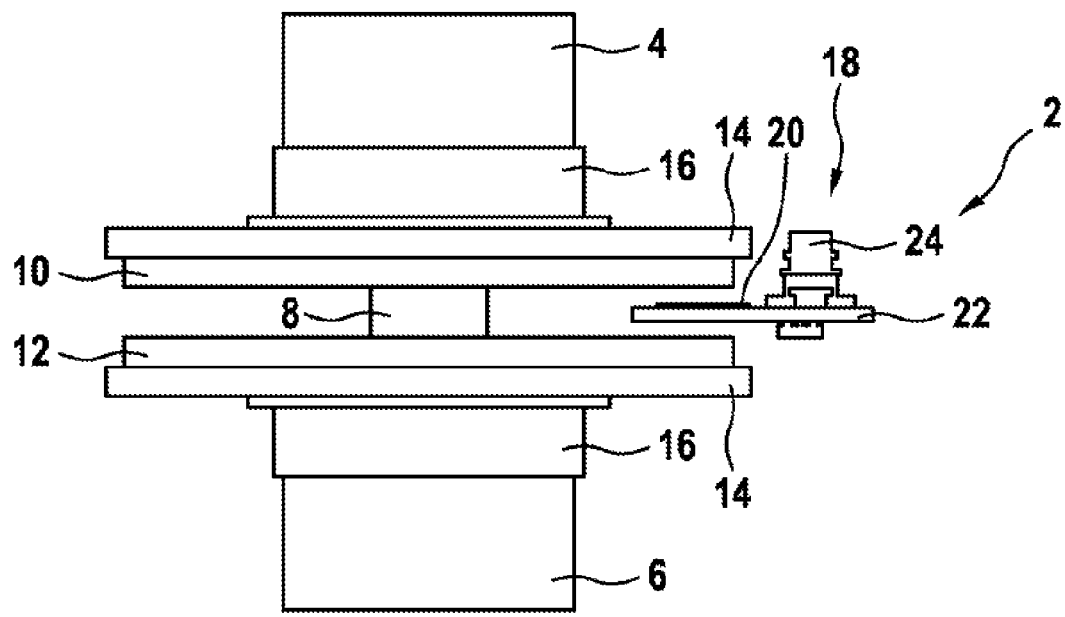
FIG. 1 illustrates in a schematic view a first embodiment of the sensor arrangement in accordance with the invention for two opposite lying shafts.
Figure 2:
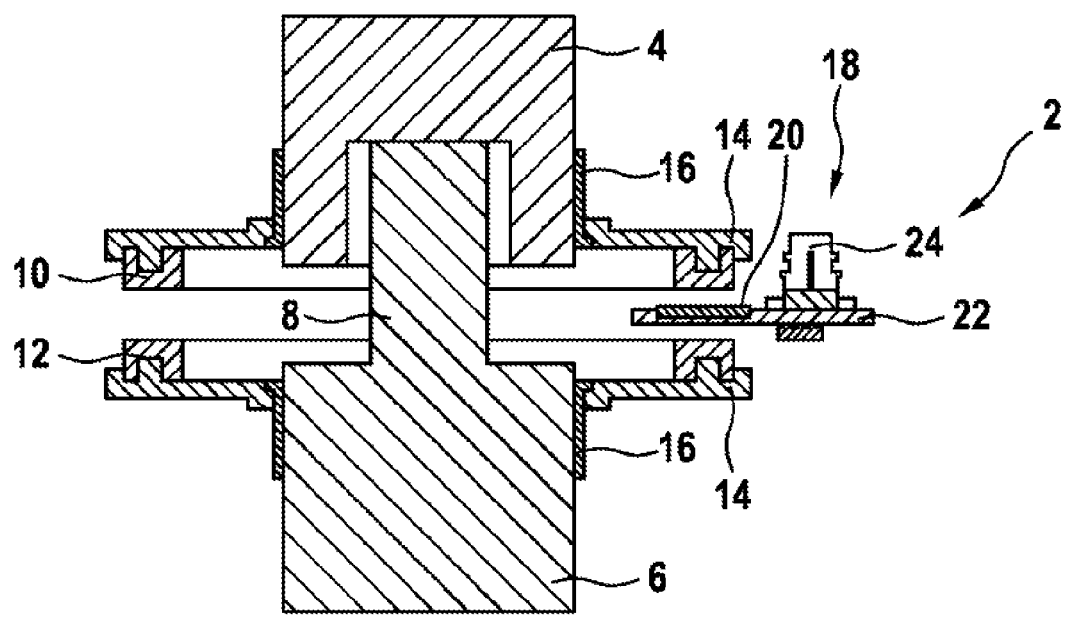
FIG. 2 illustrates in a schematic sectional view the sensor arrangement in FIG. 1.
Figure 3:
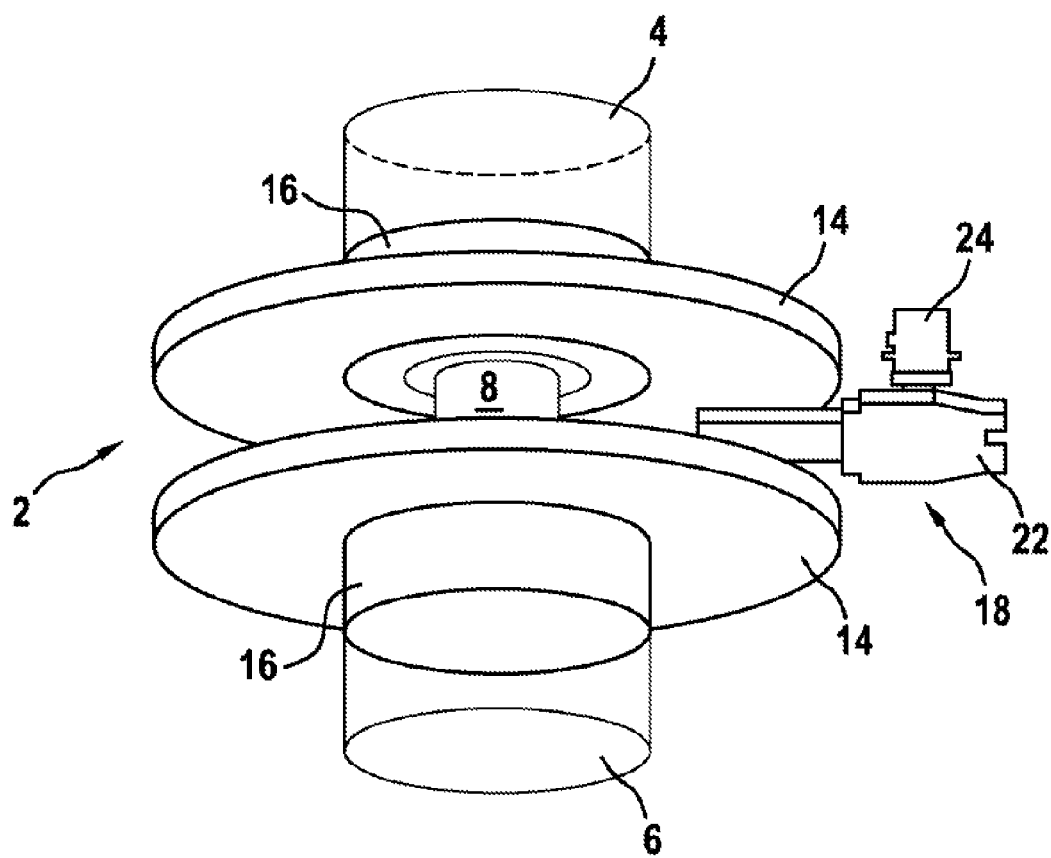
FIG. 3 illustrates the sensor arrangement in FIG. 1 from an additional perspective.

The invention is schematically illustrated in the drawings with reference to embodiments and described hereinunder in detail with reference to the drawings.

The figures are coherently and comprehensively described, identical reference numerals describe identical components.

The first embodiment of the sensor arrangement 2 in accordance with the invention that is schematically illustrated in FIGS. 1 to 4 from different perspectives and/or in different views and also details of this sensor arrangement 2 that are schematically illustrated in FIGS. 5 and 6 in the case of an embodiment of the method in accordance with the invention is embodied for the purpose of determining a rotation of a first shaft 4 and a second shaft 6 that are arranged coaxially with respect to one another and are mutually connected by way of a torsion rod 8.

The sensor arrangement 2 comprises a first arrangement of magnetic elements that are arranged in a rotatably fixed manner on the first shaft 4. This arrangement of first magnetic elements on the first shaft 4 is further designated as a first magnetic pole ring 10. A second arrangement of second magnetic elements is provided on the second shaft 6 in a similar manner, which second magnetic elements are likewise arranged on this second shaft 6 in a rotatably fixed manner, wherein this second arrangement of second magnetic elements is designated as a second magnetic pole ring 12. In this case, a magnetic pole ring 10, 12 is rotatably fastened to the respective shaft 4, 6 respectively by way of a synthetic material substrate 14 and also a sleeve 16.

Furthermore, the sensor arrangement 2 comprises a measuring arrangement 18 that comprises a magnetic field-sensitive measuring element 20. This magnetic field-sensitive measuring element 20 can by way of example be embodied as a Hall or AMR sensor. It is provided that the magnetic field-sensitive measuring element 20 is arranged in a rotatably fixed manner in the axial direction of the two shafts 4, 6 exactly midway between the opposite lying magnetic pole rings 10, 12 in relation to the two shafts 4, 6 on a component that is not illustrated here.

As a consequence, it is possible with the aid of the magnetic field-sensitive measuring element 20 to detect a superposed magnetic field that occurs as a result of a first magnetic field of the first magnetic elements that are arranged on the first shaft 4 and a second magnetic field of the second magnetic elements that are arranged on the second shaft 6.

Furthermore, the measuring arrangement 18 comprises a circuit board 22 on which is arranged the magnetic field-sensitive measuring element 20. Furthermore, a plug 24 is arranged on the circuit board 22, by way of which plug the signals of the magnetic field-sensitive measuring element 20 can be transmitted to an evaluation unit.

Generally, the two shafts 4, 6 can also rotate independently of one another relative to a common axis of rotation, wherein the torsion rod 8 is twisted, from which a torque results between the two shafts 4, 6. In addition, the two shafts 4, 6 can rotate relative to the component that is not illustrated in this figure, wherein the magnetic field-sensitive measuring element 20 is fastened to this component in a rotatably fixed manner by way of the circuit board 22 and/or the plug 24 so that the two shafts 4, 6 can rotate relative to the magnetic field-sensitive measuring element 20.

Figure 4A:
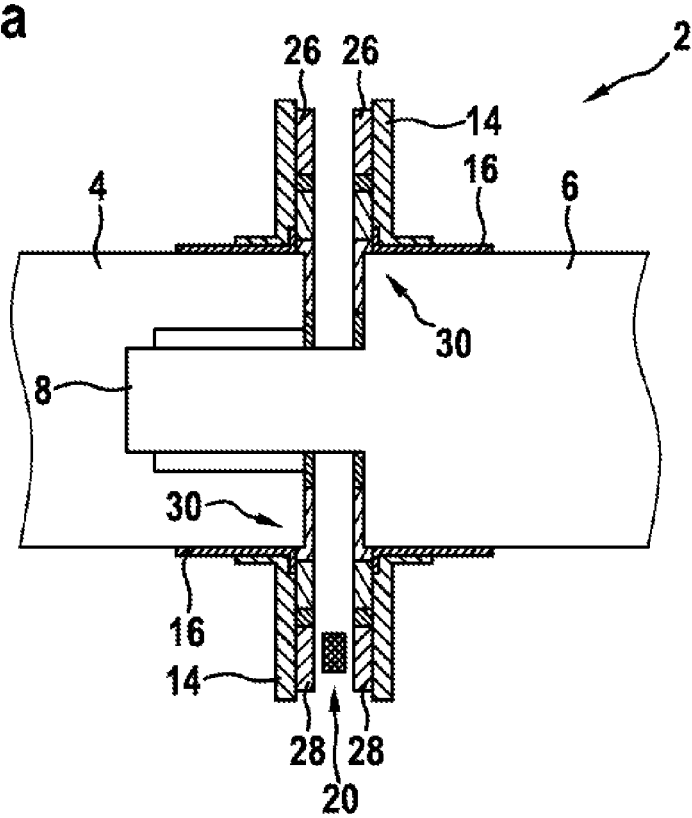
FIGS. 4a-4b illustrate in a schematic sectional view the sensor arrangement in FIG. 1 and also a first schematically illustrated detail of this sensor arrangement.
Figure 4B:
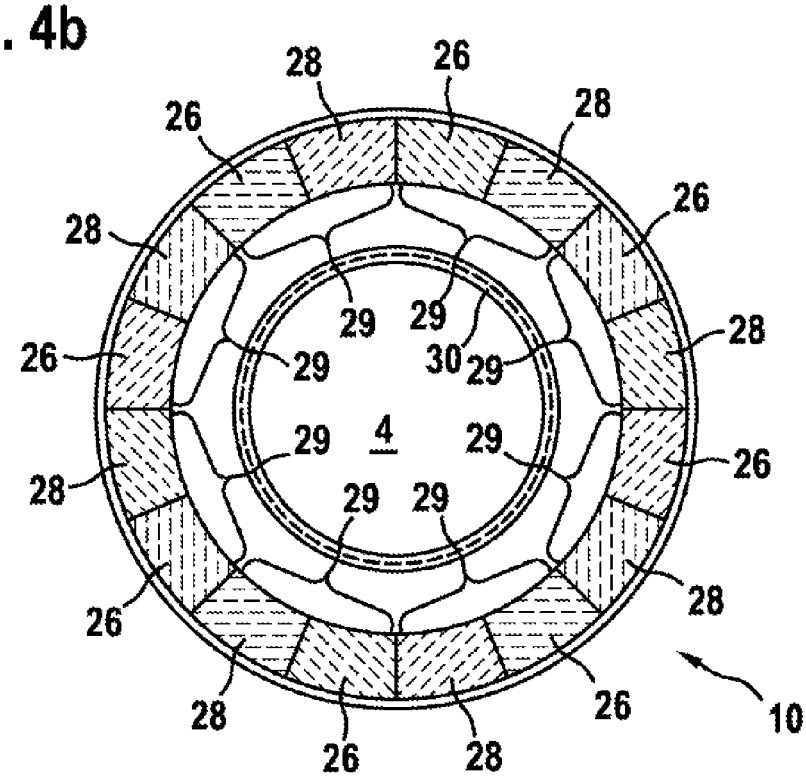

In the schematic illustration in FIG. 4, south poles 26 and north poles 28 of the individual magnetic elements 29 of the two magnetic pole rings 10, 12 having the magnetic field-sensitive measuring element 20 that is spatially fixed between the magnetic elements 29 are schematically illustrated in a sectional view (FIG. 4a) and also in plan view (FIG. 4b), wherein, without limiting the generality, FIG. 4b illustrates the first magnetic pole ring 10 that is embodied in an identical manner to the second magnetic pole ring 12 in the embodiment of the invention that is illustrated in this figure. Furthermore, FIG. 4 illustrates details of the support element 30 by way of which the magnetic elements 29 are connected to the synthetic material substrate 14 and/or to the sleeve 16 and consequently to one of the two shafts 4, 6 in a rotatably fixed manner.

As is illustrated in FIG. 4b, the individual magnetic elements 29 are embodied as ring segments of the first magnetic pole ring 10 and consequently also of the second magnetic pole ring 12. Two adjacent magnetic elements 29 are arranged next to one another on a shaft 4, 6 with similarly aligned field lines so that the field lines of directly adjacent magnetic elements 29 are aligned in an alternating manner either in the north-south direction or the south-north direction. Furthermore, pole transitions occur between two adjacent south poles 26 and north poles 28 of a magnetic element 29 and/or of adjacent magnetic elements 29.

The two magnetic pole rings 10, 12 are embodied in an absolutely identical manner in the described embodiment in relation to the number of the pole transitions and an accuracy of the magnetization. FIG. 4b illustrates in an exemplary manner a magnetic pole ring 10 having 16 pole transitions.

Figure 5A:
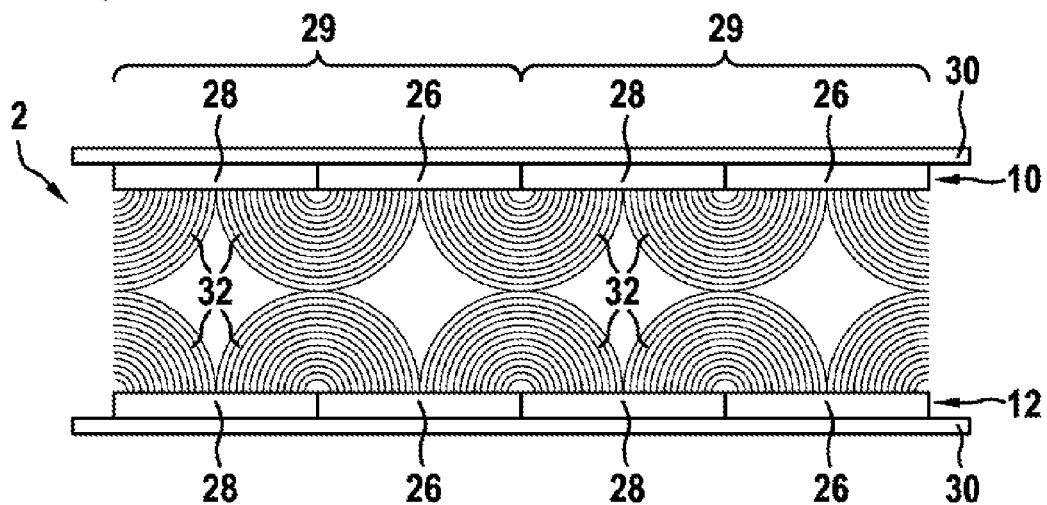
FIGS. 5a, 5b and 5c illustrate in a schematic view a second detail of the sensor arrangement in FIG. 1 in the case of an implementation of an embodiment of the method in accordance with the invention.
Figure 5B:
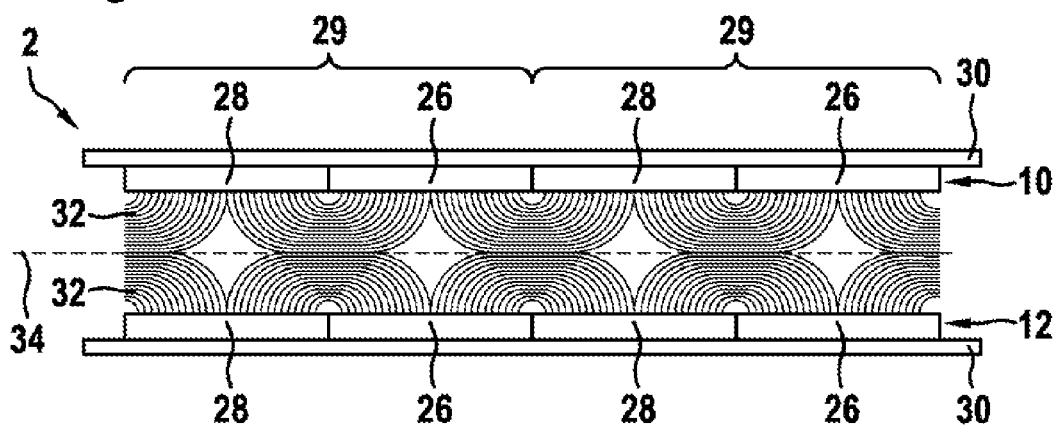
Figure 5C:
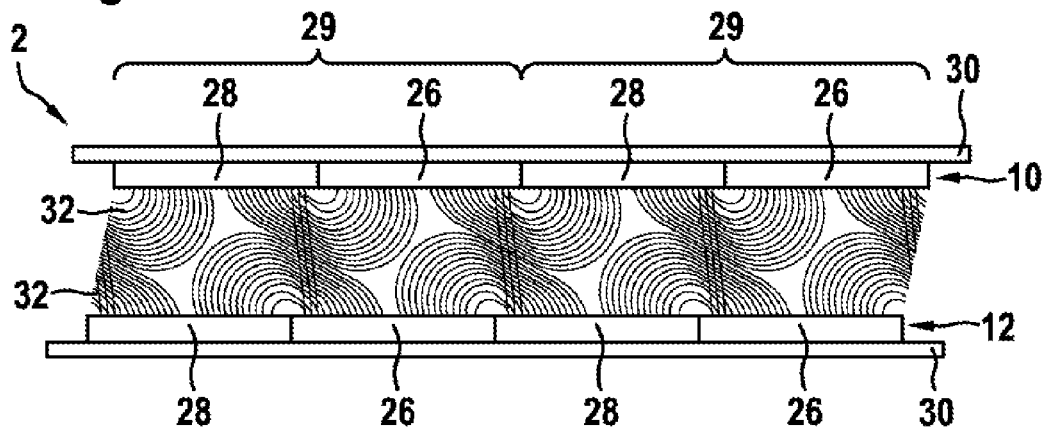

FIG. 5 illustrates a functional principle of the sensor arrangement 2 having two magnetic pole rings 10, 12 of which in each case a detail, ideally in one plane, is schematically illustrated. In the initial position, identical poles, in other words south poles 26 and north poles 28 of magnetic elements 29 of two magnetic pole rings 10, 12 lie opposite one another. As a consequence, south poles 26 and north poles 28 are arranged in each case opposite one another (FIG. 5a). If the gap between the two magnetic pole rings 10, 12 is sufficiently small that the magnetic fields 32 of the opposite lying magnetic elements 29 influence one another, these magnetic fields 32 are correspondingly distorted (FIG. 5b). Generally, the magnetic field is consequently exactly zero at precisely the midway plane (dashed line 34) between the two magnetic pole rings 10, 12. If the magnetic pole rings 10, 12 are rotated relative to one another or, as is schematically illustrated in FIG. 5c, pushed together, the resulting superposed magnetic field thus changes midway between the two magnetic pole rings 10, 12. This changed magnetic field can for example be measured with the aid of the magnetic field-sensitive measuring element 20. The measurement of the change of the superposed resulting magnetic field is consequently a measurement for the magnitude of rotation of the shafts 4, 6 relative to one another.

Since the field directions of the magnetic fields 32 also periodically change by way of example in a sine form in dependence upon the relative rotation and number of the pole transitions or reversal of polarity between adjacent poles, in other words south and north poles 26, 28 of a shaft 4, 6, the change of the field direction can also be measured and evaluated with the aid of one or several AMR sensors. The steepness of the sine flanks in this case is a measurement for the relative rotation. Since the relative change of the magnetic fields 32 is very low to zero in the maxima and minima of the sine function, for this case, the arrangement of several AMR sensors having a different periodicity than a periodicity of the poles of the magnetic pole rings 10, 12 is provided.

Figure 6A:
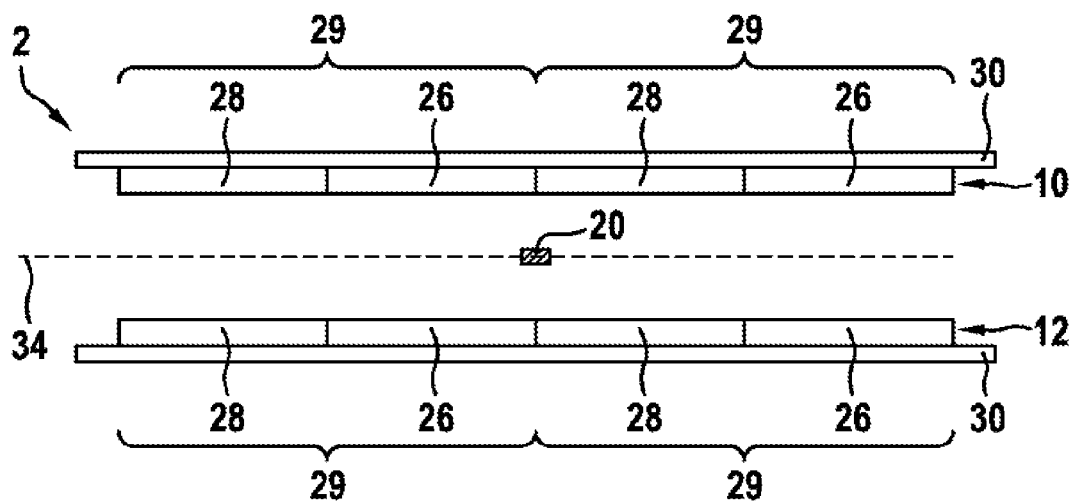
FIGS. 6a-6b illustrate in a schematic view a third detail of the arrangement in FIG. 1 in the case of an embodiment of the method in accordance with the invention.

The arrangement in accordance with the invention corresponding to FIG. 5 is schematically illustrated in FIG. 6, wherein the illustration of the magnetic fields 32 is omitted. In its place in FIG. 6, the magnetic field-sensitive measuring element 20 is illustrated at precisely the midway plane between the magnetic elements 29 and also south and north poles 26, 28 of the two shafts 10, 12 and consequently at precisely the midway plane between the two magnetic pole rings 10, 12. The sensor arrangement 2 in FIG. 6a is located, corresponding to the illustration in FIGS. 5a and 5b, in the so-called initial position that is defined in such a manner that the two shafts 4, 6 and consequently the magnetic pole rings 10, 12 are not rotated relative to one another and consequently are rotated about an angle of 0° relative to one another. In this case, similar poles, in other words south poles 26 and north poles 28 of the two opposite lying magnetic pole rings 10, 12 whose field lines are aligned in the same direction, are arranged precisely opposite one another.

Figure 6B:
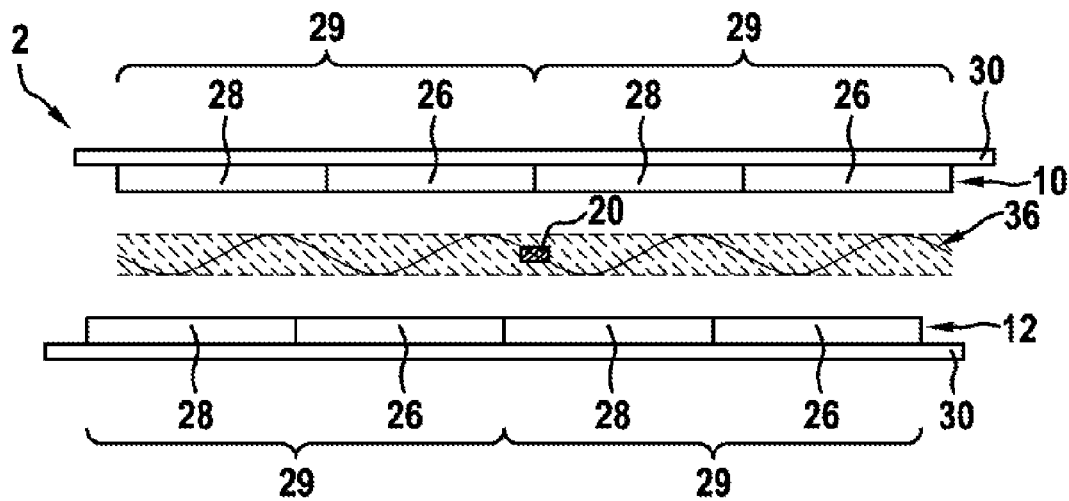

FIG. 6b illustrates the sensor arrangement 2 in the case of a small rotation of the two shafts 4, 6 relative to one another that also produces a rotation of the south and north poles 26, 28, which are arranged on the two shafts, and also of the magnetic pole rings 10, 12. A sine form change of the superposed magnetic field that occurs as a result of the magnetic fields 32 of the magnetic elements 29 occurs by means of the rotation of the shafts 4, 6 relative to one another about the common axis of rotation, wherein a change of the field strength of the resulting magnetic field in FIG. 6b is indicated here by means of a sine curve 36.

Figure 7:
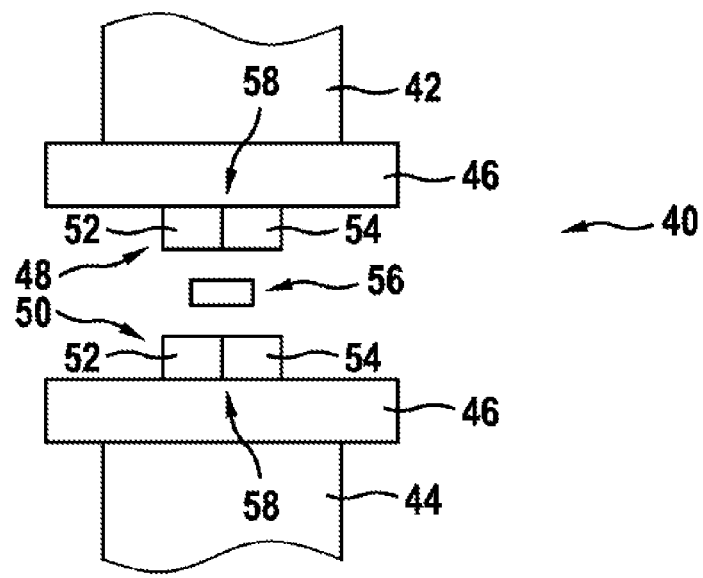
FIG. 7 illustrates in a schematic view a second embodiment of a sensor arrangement in accordance with the invention.

A second embodiment of the sensor arrangement 40 in accordance with the invention is schematically illustrated in FIG. 7. It is likewise possible with the aid of this sensor arrangement 40 to determine a relative rotation of a first shaft 42 and a second shaft 44, said shafts being arranged coaxially with respect to one another. Support elements 46 are arranged on each shaft 42, 44; magnetic elements 48, 50 that are embodied as ring segments having a south pole 52 and a north pole 54 are in turn arranged on said support elements and consequently fastened to the shafts 42, 44.

In contrast to the first embodiment of the sensor arrangement in accordance with the invention, in which a magnetic pole ring 10, 12 having continuous circumferential magnetic elements 29 is arranged on each shaft 4, 6, the second embodiment of the sensor arrangement 40 that is illustrated in FIG. 7 comprises in each case only one magnetic element 48, 50 on each shaft 42, 44. A first magnetic element 48 is arranged on the first shaft 42. A second magnetic element 50 is arranged on the second shaft 44. A magnetic field-sensitive measuring element 56 is arranged as an additional component of the sensor arrangement 40 in FIG. 7 between the magnetic elements 48, 50 in the axial direction of the two shafts 42, 44.

In addition, FIG. 7 illustrates the sensor arrangement 40 in a so-called initial position. It is provided that the south pole 52 of the first magnetic element 48 on the first shaft 42 lies opposite the south pole 52 of the magnetic element 50 on the second shaft 44. In addition, the north pole 54 of the first magnetic element 48 is arranged opposite the north pole 54 of the second magnetic element 50. Furthermore, each magnetic element 48, 50 comprises a pole transition 58 between the south and north pole 52, 54, wherein these pole transitions 58 are likewise arranged opposite one another in the illustrated initial position. The magnetic field-sensitive measuring element 56 is arranged in the initial position between the second pole transitions 58.

Whilst implementing the method in accordance with the invention, a superposed magnetic field is measured and consequently detected by the magnetic field-sensitive measuring element 56 midway between the magnetic elements 48, 50, which superposed magnetic field occurs as a result of the superposition of the magnetic fields of the magnetic element 48 on the first shaft 42 and also of the magnetic element 50 on the second shaft 44. If the shafts 42, 44 and consequently also the sensor arrangement 40 are located in the initial position, as is schematically illustrated with reference to FIG. 7, the resulting magnetic field is therefore zero midway between the magnetic elements 48, 50 of the two shafts 42, 44. If the two shafts 42, 44 rotate relative to one another, the superposed magnetic field also changes, wherein an angle for the rotation of the two shafts 42, 44 relative to one another is deduced from a change in this superposed magnetic field.

In the two proposed embodiments of the sensor arrangement 2, 40, a method for determining a relative rotation of two shafts 4, 6, 42, 44 that are arranged coaxially with respect to one another can be implemented. The sensor arrangement 2, 40 comprises at least one magnetic element 29, 48 that is arranged on a first shaft 4, 42, at least one magnetic element 29, 50 that is arranged on a second shaft and also at least one magnetic field-sensitive measuring element 20, 56 that is arranged in a spatially fixed manner between the magnetic elements 29, 48, 50 of the two shafts 4, 6, 42, 44, wherein a magnetic field that occurs as a result of a superposition of the magnetic fields 32 of the magnetic elements 29, 48, 50 of the two shafts 4, 6, 42, 44 is detected by the at least one magnetic field-sensitive measuring element 20, 56.

Poles, in other words south and north poles 26, 28, 52, 54 can be arranged on a shaft 4, 6, 42, 44 next to one another in an alternating manner in the radial direction. A south pole 26, 52 therefore abuts against a north pole 28, 54 in a radial direction between two adjacent magnetic elements 29, 48, 50 that are arranged on a shaft 40, 42, 44. A pole transition 58 is provided between two magnetic elements 29, 48, 50 that contact one another and/or between two different poles, in other words between a south pole 26, 52 and a north pole 28, 54. The identical number of magnetic elements 29, 48, 50 is arranged on each shaft 4, 6, 42, 44, wherein a magnetic field 32 of each magnetic element 29, 48, 50 comprises identical values of field strength and field direction.

An initial position can be defined for the sensor arrangement 2, 40, for which it is provided that the two shafts 4, 6, 42, 44 are rotated relative to one another about 0°, wherein identical poles, in other words either south poles 26, 52 or north poles 28, 54 are arranged along a radial circumference of the two shafts at an angle position of x° on the first shaft 4, 42 and on the second shaft 6, 44. The at least one magnetic field-sensitive measuring element 20, 56 is arranged in the axial direction of the shaft 4, 6, 42, 44 generally precisely midway between the magnetic elements 29, 48, 50. In addition, the at least one magnetic field-sensitive measuring element 20, 56 can be arranged in an initial position of the sensor arrangement 2, 40 in the axial direction of the shafts 4, 6, 42, 44 between two pole transitions 58 that are arranged between the two shafts 4, 6, 42, 44.

A rotation of the two shafts 4, 6, 42, 44 relative to one another can be deduced from a change of the magnetic field that occurs as a result of the superposition of the magnetic fields 32 of the magnetic elements 29, 48, 50 of the two shafts 4, 6, 42, 44.

A sensor arrangement 2, 40 can comprise a user-defined number of magnetic field-sensitive measuring elements 20, 56. A plurality of magnetic field-sensitive measuring elements 20, 56 of this type are arranged in a circle around the common axis of rotation of the two shafts 4, 6, 42, 44 generally at identical angular spacings with respect to one another. If by way of example k magnetic field-sensitive measuring elements 20, 56 are provided, an angular spacing between two magnetic field-sensitive measuring elements 20, 56 amounts to 360°/k. In addition, two pole transitions 58 that are arranged on opposite lying shafts 4, 6, 42, 44, can likewise be spaced at an angular spacing of 360°/k.

Figure 8:
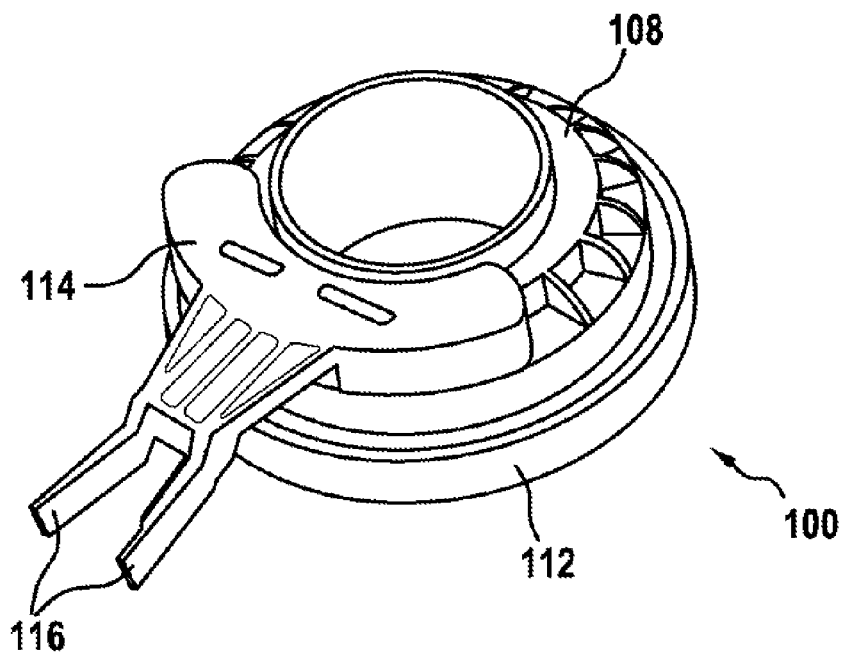
FIG. 8 illustrates in a schematic view an example of a torque sensor known in the prior art.
Figure 9A:
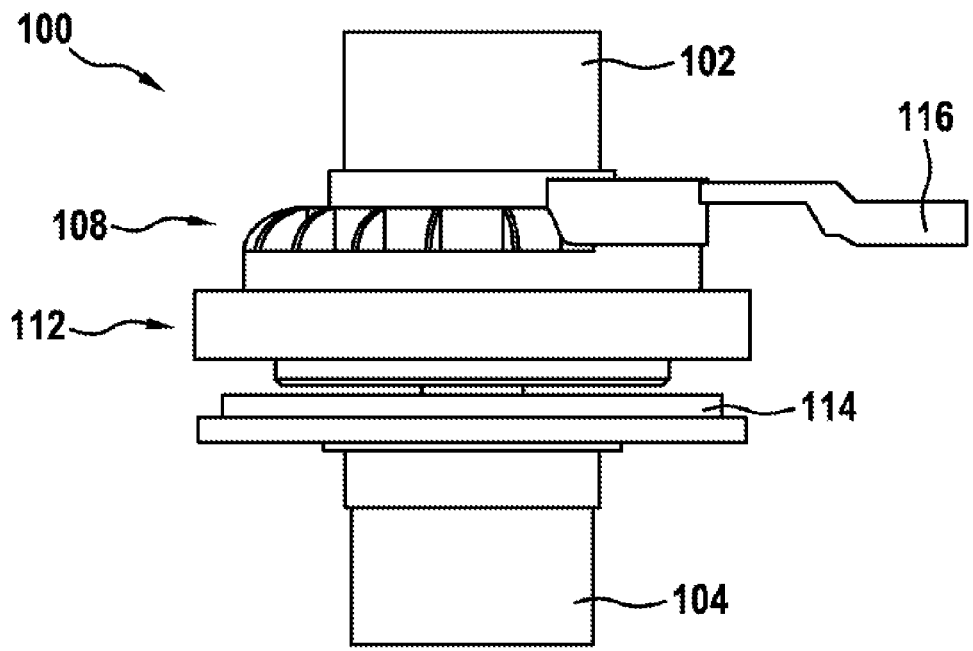
FIGS. 9a-9b illustrate in a schematic view first details of the torque sensor in FIG. 8.
Figure 9B:
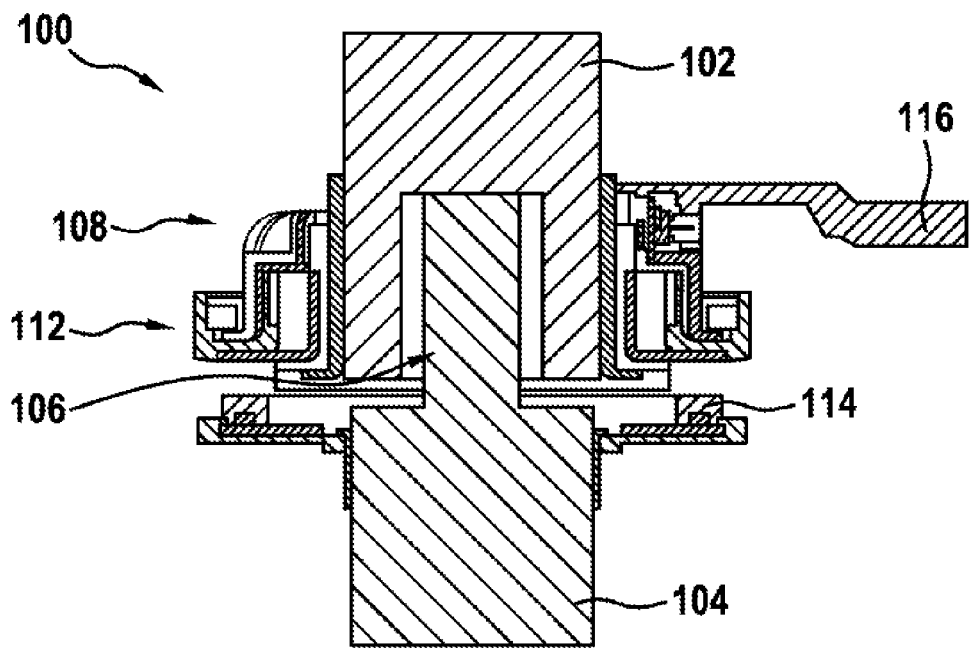
Figure 10A:
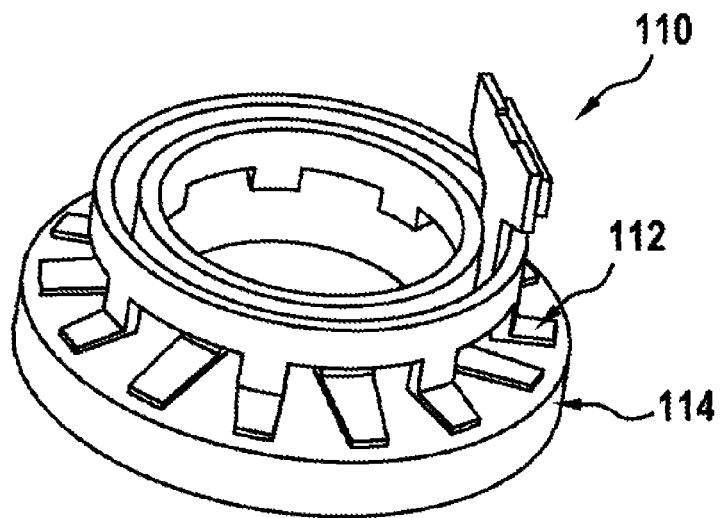
FIGS. 10a-10b illustrate illustrates in a schematic view second details of the torque sensor in FIG. 8.
Figure 10B:
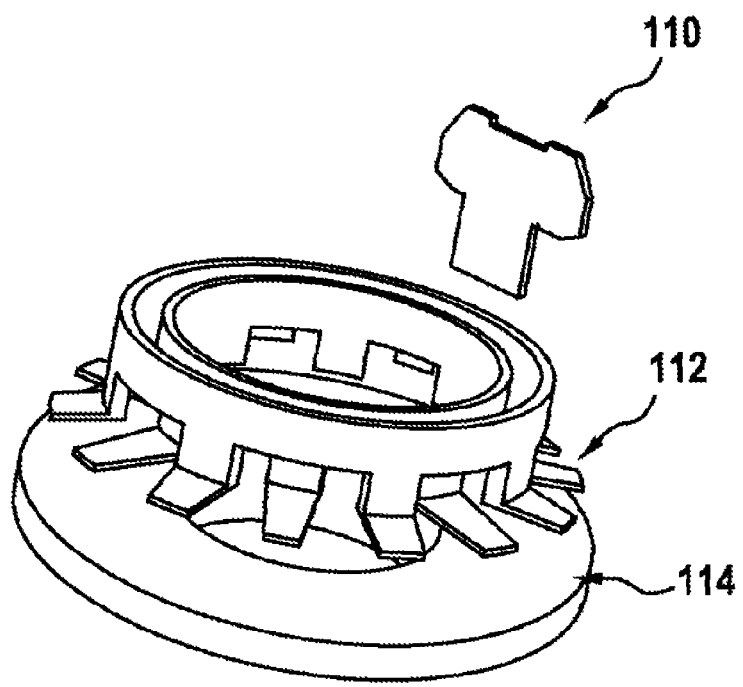

The torque sensor 100 that is illustrated in FIGS. 8 to 10 and is known in the prior art is embodied for the purpose of determining a torque between a first and a second shaft 102, 104, said shafts being connected to one another by way of a torsion rod 106. This torque sensor 100 comprises a sensor unit 108 having a magnetic field-sensitive sensor element 110, a magnetic flux unit 112 that is fastened to the first shaft 102 in this case and also a magnetic pole ring 114 that is fastened to the second shaft 104. The sensor unit 108 is fastened to a component, not further illustrated, by way of a fastening element 114 that comprises fastening arms 116, with respect to which the two shafts 102, 104 can rotate. A magnetic field that is generated by the magnetic pole ring 114 is amplified by means of the magnetic flux unit 112 on the first shaft 102, wherein the amplified magnetic field is detected by the sensor unit 108.

What is claimed is:

1. A sensor arrangement for determining a relative rotation of first and second shafts (4, 6, 42, 44) that are arranged coaxially with respect to one another about a common axis, said sensor arrangement comprising a first plurality of magnetic elements (29, 48) that are arranged on the first shaft (4, 42), a second plurality of magnetic elements (29, 50) that are arranged on the second shaft (6, 44) and also a plurality of magnetic field-sensitive measuring elements (20, 56) that are arranged in a spatially fixed manner between the first and the second pluralities of magnetic elements (29, 48, 50) of the first and second shafts (4, 6, 42, 44) and detect a magnetic field that occurs as a result of a superposition of the magnetic fields (32) of the first and the second pluralities of magnetic elements (29, 48, 50) of the first and second shafts (4, 6, 42, 44), wherein the plurality of magnetic field-sensitive measuring elements (20, 56) are arranged around the common axis at identical angular spacings with respect to one another, and wherein a periodicity of the plurality of magnetic field-sensitive measuring elements (20, 56) differs from a periodicity of the first and the second pluralities of magnetic elements (29, 48, 50) of the first and second shafts (4, 6, 42, 44).

2. The sensor arrangement as claimed in claim 1, in which poles of a magnetic element (29, 48, 50) are arranged on each shaft (4, 6, 42, 44) in such a manner that they are aligned in the radial direction.

3. The sensor arrangement as claimed in claim 1, in which two magnetic elements (29, 48, 50) that are arranged next to one another on a shaft (4, 6, 42, 44) contact one another and provide a pole transition (58).

4. The sensor arrangement as claimed in claim 1, in which each shaft (4, 6, 42, 44) comprises an identical number of magnetic elements (29, 48, 50), wherein a magnetic field (32) of each magnetic element (29, 48, 50) comprises the identical values of field strength and field direction.

5. The sensor arrangement as claimed in claim 2, for which an initial position is defined, for which it is provided that the two shafts (4, 6, 42, 44) are rotated relative to one another about 0°, wherein poles are identically arranged along a radial circumference of the two shafts (4, 6, 42, 44).

6. The sensor arrangement as claimed in claim 1, in which the first plurality of magnetic elements (29, 48) that are arranged on the first shaft (4) form a first magnetic pole ring (10) and the second plurality of magnetic elements (29, 50) that are arranged on the second shaft (6) form a second magnetic pole ring (12).

7. The sensor arrangement as claimed in claim 1, in which the at least one magnetic field-sensitive measuring element (20, 56) is arranged in an axial direction of the first and second shafts (4, 6, 42, 44) midway between the first plurality of magnetic elements (29, 48, 50) that are arranged on the first shaft (4, 42) and the second plurality of magnetic elements that are arranged on the second shaft (6, 44).

8. A method for determining a relative rotation of first and second shafts (4, 6, 42, 44) that are arranged coaxially with respect to one another about a common axis having a sensor arrangement (2, 40) that comprises a first plurality of magnetic elements (29, 48) that are arranged on the first shaft (4, 42), a second plurality of magnetic elements (29, 50) that are arranged on the second shaft (6, 44), and also a plurality of magnetic field-sensitive measuring elements (20, 56) that are arranged spatially fixed between the first and the second pluralities of magnetic elements (29, 48, 50) of the first and second shafts (4, 6, 42, 44), wherein a magnetic field that results from a superposition of the magnetic fields (32) of the first and the second pluralities of magnetic elements (29, 48, 50) of the first and second shafts (4, 6, 42, 44) is detected by the plurality of magnetic field-sensitive measuring elements (20, 56), wherein a periodicity of an arrangement of the plurality of magnetic field-sensitive measuring elements (20, 56) differs from a periodicity of the first and the second pluralities of magnetic elements (29, 48, 50) of the first and second shafts (4, 6, 42, 44), and wherein the plurality of magnetic field-sensitive measuring elements (20, 56) are arranged around the common axis at identical angular spacings with respect to one another.

9. The method as claimed in claim 8, in which the relative rotation of the first and second shafts (4, 6, 42, 44) is deduced from a change of the magnetic field that occurs as a result of the superposition of the magnetic fields (32) of the first and the second pluralities of magnetic elements (29, 48, 50) of the first and second shafts (4, 6, 42, 44).

10. The sensor arrangement as claimed in claim 2, in which two magnetic elements (29, 48, 50) that are arranged next to one another on a shaft (4, 6, 42, 44) contact one another and provide a pole transition (58).

11. The sensor arrangement as claimed in claim 10, in which each shaft (4, 6, 42, 44) comprises an identical number of magnetic elements (29, 48, 50), wherein a magnetic field (32) of each magnetic element (29, 48, 50) comprises the identical values of field strength and field direction.

12. The sensor arrangement as claimed in claim 11, for which an initial position is defined, for which it is provided that the two shafts (4, 6, 42, 44) are rotated relative to one another about 0°, wherein poles are identically arranged along a radial circumference of the two shafts (4, 6, 42, 44).

13. The sensor arrangement as claimed in claim 12, in which the first plurality of magnetic elements (29, 48) that are arranged on the first shaft (4) form a first magnetic pole ring (10) and the second plurality of magnetic elements (29, 50) that are arranged on the second shaft (6) form a second magnetic pole ring (12).

14. The sensor arrangement as claimed in claim 13, in which the at least one magnetic field-sensitive measuring element (20, 56) is arranged in an axial direction of the first and second shafts (4, 6, 42, 44) midway between the first and the second pluralities of magnetic elements (29, 48, 50) that are arranged on the first and second shafts (4, 6, 42, 44).

\* \* \* \* \*